United States Patent [19]

Guyot-Sionnest

[11] Patent Number: 5,087,910
[45] Date of Patent: Feb. 11, 1992

[54] ELECTRONIC KEYBOARD FOR ONE-HAND OPERATION

[76] Inventor: Laurent Guyot-Sionnest, 82 rue du Général Leclerc, 92270 Bois-Colombes, France

[21] Appl. No.: 585,012

[22] Filed: Sep. 14, 1990

Related U.S. Application Data

[63] Continuation of Ser. No. 285,357, Dec. 24, 1988, abandoned, which is a continuation of Ser. No. 890,464, Jul. 29, 1986, abandoned.

[30] Foreign Application Priority Data

Jul. 29, 1985 [FR] France .................... 85 11532

[51] Int. Cl.$^5$ .......................................... G09G 3/02
[52] U.S. Cl. ................................. 340/711; 341/22; 400/489
[58] Field of Search ............. 340/711, 712, 706; 341/22, 21, 23, 25, 26, 24; 400/484, 473, 402, 485, 486, 487, 488, 489

[56] References Cited

U.S. PATENT DOCUMENTS

| | | | |
|---|---|---|---|
| 3,022,878 | 2/1962 | Seibel et al. | 340/365 R |
| 3,166,636 | 1/1965 | Rutland et al. | 340/711 |
| 3,487,371 | 3/1987 | Frank | 382/13 |
| 4,005,388 | 1/1977 | Morley et al. | 340/365 R |
| 4,042,777 | 8/1977 | Bequaert et al. | 340/365 R |
| 4,420,744 | 12/1983 | Jesson | 341/25 |
| 4,443,789 | 4/1984 | Endfield et al. | 340/365 R |
| 4,467,321 | 8/1984 | Volnak | 340/365 R |

FOREIGN PATENT DOCUMENTS

| | | |
|---|---|---|
| 0002247 | 6/1979 | European Pat. Off. . |
| 2360427 | 3/1978 | France . |
| 2418493 | 9/1979 | France . |
| 2064187 | 6/1981 | United Kingdom ............ 400/484 |
| 2071578 | 9/1981 | United Kingdom . |
| 2076743 | 12/1981 | United Kingdom . |
| 2149946 | 6/1985 | United Kingdom . |

OTHER PUBLICATIONS

"Qwerty is Obsolete", *Interface Age*, Circle Inquiry No. 32, Jan. 1978, by Sid Own, pp. 56-59.
"Semi-Captive Keyboard", *Xerox Disclosure Journal*, vol. 1, No. 2, Feb. 1976, by D. C. Kowalski, p. 85.
W. C. McCormack, "Single Keybutton Four-Way Switch", IBM Technical Disclosure, vol. 21, No. 8, Jan. 1979, p. 3261.
"Keyboard for Handheld Computer", IBM Technical Disclosure, vol. 27, No. 10A, Mar. 1985.

*Primary Examiner*—Alvin E. Oberley
*Assistant Examiner*—Xiao M. Wu
*Attorney, Agent, or Firm*—Young & Thompson

[57] ABSTRACT

The electronic keyboard for one-hand operation, more particularly for generating alphanumeric and analog characters and/or processing instructions, comprises a plurality of keys (2, 4) and an electronic circuit connected electrically to said keys in order to interpret the state of the keys (2, 4) and deliver a signal indicative thereof, said electronic circuit also being connected to a display (6) and to external connection. It comprises at least two keys (2) associated with the fingers of a hand other than the thumb and a key (4) associated with the thumb, each key (2) associated with a finger of the hand other than the thumb being adapted to assume three different states in response to said finger and the thumb key (4) can assume five different states in response to the thumb (see FIG. 1).

20 Claims, 7 Drawing Sheets

FIG_16

ELECTRONIC KEYBOARD FOR ONE-HAND OPERATION

This application is a continuation, of application Ser. No. 285,357, filed 12/14/88, which is a continuation of application Ser. No. 06/890,464, filed 7/29/86 now both abandoned.

This invention relates to an electronic keyboard for one-hand operation, more particularly for generating alphanumeric and analog characters and/or processing instructions.

The means most frequently used at the present time for generating alphanumeric characters (computer terminal or typewriter keyboards) are simply an electrical or electronic transposition of the mechanical keyboards of the end of the 19th century. These original mechanical keyboards are characterised in that actuation of each key can at most generate only two different signs. A large number of keys, at least 60, is therefore necessary to generate all the signs used for written messages.

Because of the large number of keys, the person originating the signs with these keyboards must move his or her hands over an appreciable area. These movements have two adverse effects:

The first is that a considerable proportion of the time spent on producing the signs is taken up simply by moving the hands, without any real sign generation.

The second effect is that operators must look at the keyboard to aim at and actuate the correct key, so that the operator cannot look at whatever is to be transcribed and/or check the result or concentrate fully on the message requiring to be created, unless the operator undergoes long training and instruction (many tens of hours) to acquire sufficient skill not to have to look at the keyboard to produce a message without any mistakes.

Apart from these functional disadvantages, conventional keyboards are bulky (more than three hundred $cm^2$ for a keyboard for operation with all ten fingers), heavy and expensive, since at least 60 discrete electromechanical devices have to be manufactured. Finally, the use of these keyboards requires a fairly rigid and accurate sitting position, and this is a constraint in comparison with handwriting, entailing considerable fatigue amongst all non-specialized users.

The practical results are that the professional use of this type of keyboard has been limited to a specialized group of people and that the speed of use of the keyboard by any other users is often only a half to one-fifth of the usual writing speed with a pen or pencil.

With the advent of electronics and computers, manufacturers have included facilities for reducing the number of keys. This has been done by adding conversion keys and microprocessor-operated electronic tables which enable 3 or 4 different signs to be generated with the same key. This reduction allows generation of up to two hundred and fifty-six different signs (e.g. those of the extended ASCII code). However, this reduction is limited by the fact that it is not possible to go beyond the four different signs indicated on the key if the unskilled operator is to find the required key quickly enough. Also, these conversion keys are one-off keys and, in the case of half of the keys, this breaks with normal practice and the training of actuating one key with a given finger of a given hand. For computer terminal keyboards designers have had to add function keys, in a minimum of ten and very frequently 24 or 36.

The disadvantage of these function keys lies in the fact that practically no one can actuate them without looking where they are and without looking how to return to the normal operating position. This disadvantage has been such as to lead to the production of devices such as the "mouse", touch-actuated screens, icon controls, and so on. Consequently, with electronic keyboards, even skilled operators suffer disadvantages from the design of keyboards with more than 60 keys.

A number of devices have been described to reduce the disadvantages of conventional keyboards. Some have aimed at increasing the operating speed in order to approach the speed of the spoken word (more than 100 words per minute). Others have tried to facilitate the production of coded signs by unskilled users.

In this case the solutions have frequently aimed at allowing one-hand operation, the hand being positioned statically, the effect being achieved simply by the combined action of the fingers on a limited number of keys. On this basis the inventors have tried to reduce the time required to attain adequate skill. In addition, and unlike the arbitrary positions of the keys of the conventional keyboard, these inventors have tried to achieve rapid learning for the operation required to generate a given signal. These new systems are not proving successful for a number of reasons.

The first lies in the fact that with five ordinary keys the number of different signs that can be readily generated is too low for the requirements of written messages. The reason for this is that five ordinary keys allow the direct generation $(2 \times 2 \times 2 \times 2 \times 2 - 1)$, i.e. thirty-one signs while written messages use more than one hundred different signs and require a good ten presentation instructions. In addition to these requirements are those of the "orders" to be applied to the machine used. The second reason lies in the fact that memorization of the combinations requires an appreciable learning effort. This inevitable learning effort is considerable particularly because the limitation of the possible codes makes some combinations relatively illogical and irksome to the potential user. Also, the products on offer do not do away with the need to learn and use conventional keyboards, which are the only ones offered on most terminals at workplaces. Finally, these devices are of little interest to people already trained on conventional keyboards.

Amongst the known keyboards of the kind referred to we may cite those described in U.S. Pat. Nos. 3,022,878 and 4,042,777 and French patent applications 2 360 427 and 2 418 493. These particularly have the disadvantages associated with an excessive or inadequate combination, long and relatively difficult learning, utilization in some cases being relatively complicated for an unskilled operator, and unproved versatility.

In particular, chord keyboards in which each finger must be applied simultaneously to a plurality of adjacent keys (U.S. Pat. No. 4,042,777 and EP-A-002247) have the disadvantage of requiring great skill for the separate contacts are very close together and require finger movements in a number of directions; of not being conducive to operation without looking at the keys because the signs are engraved on the keys; of not being universal; of being bulkier than is admissible for the pocket or for the wrist and of not being operable by either hand. The keyboard described by FR-A-2 418 493 is handicapped by an inadequate combination and by the use of the little finger, which is not particularly adroit; has the disadvantage of not being usable by either the right or left hand at choice; of not having any simple mnemonics and of having no correction system to cover the mistaken actuation of a key whether due to clumsiness or accident. Finally, the keyboards described in U.S. Pat. Nos. 3,022,878 and 3,428,747 have an excessive combination which makes the mnemonics unrealistic, use complex keys not adapted to operation without looking, and have no correction system for mistaken key actuation due to clumsiness or accident.

The object of this invention therefore is to propose an electronic keyboard which can be operated by one hand by an unskilled user, which can be used without looking, which is reliable, i.e. with substantially zero risk of operating errors, of reduced size, sufficient power, i.e. capable of generating all the alphanumeric characters and processing instructions required in the most conventional uses, multi-purpose, i.e. adapted to be connected to computers, various printers, telephone equipment and keyboard control devices of any kind, readily adaptable to any language and any technique, while being easy to understand, learn and use.

Thus the electronic keyboard according to the invention comprises a plurality of keys and an electronic circuit electrically connected to said keys to interpret the state of the keys and deliver a signal indicative thereof, said electronic circuit also being connected to display means and external connection means.

According to the invention, the keyboard is characterised in that it comprises at least two keys associated with the fingers of the hand other than the thumb and one key associated with the thumb, each key associated with a finger of the hand other than the thumb being capable of assuming three different states in response to said finger and comprising two parts extending in continuation of said finger, so that each of the two parts can be actuated by the corresponding finger at the same time as other parts of adjacent keys by other fingers, without appreciable movement of the hand, and the key associated with the thumb can assume five different states in response to the thumb, said key comprising four parts which are so disposed as to be actuated selectively by the thumb without appreciable movement of the hand and at the same time as a part of each key associated with the fingers other than the thumb.

Since each key is associated with a given finger this obviates any risk of operating errors such as may occur when the generation of a given signal requires the simultaneous actuation of two keys by the same finger. Also, since the keys are so disposed as to be operable simultaneously by the fingers of the hand without any appreciable hand movement, use of the keyboard is relatively untiring and practical. Finally, the three separate states of the keys intended for the fingers other than the thumb and the five separate states of the key intended for the thumb give a sufficiently ample combination while remaining simple since, for example, it is possible, using three "finger only" keys and the "thumb" key, to generate directly up to $(3\times3\times3\times3\times5)-1$ i.e. one hundred and thirty-four different signs or instructions.

Preferably, the two parts of each key adapted to be actuated by a finger other than the thumb are sufficiently close together to be actuated successively by a front-to-rear movement and vice-versa of the finger tip and the four parts of the key adapted to be actuated by the thumb comprise a first pair disposed symmetrically on either side of an axis on which the other pair is disposed, said parts being sufficiently close together to be actuated successively by a front-to-back movement and vice-versa of the thumb tip for one of the pairs and by a movement from the inside to the outside of the hand and vice-versa of the thumb tip for the other pair.

In this way the efficacy of use of the keyboard is enhanced by utilizing the natural and hence easy movements of the fingers of one hand.

Also, since the profile of the keys is adapted to the shape of the fingers and to the nature of their preferential movements, this efficacy is achieved more readily.

According to one advantageous embodiment of the invention, the two parts of the keys adapted to be actuated by the fingers other than the thumb each have a profile which curves towards the interior of the corresponding key, inclined upwardly from the centre of said key towards the exterior of each part in the direction of movement of the fingers and perceptible to the touch, and an action on each of these parts results in a change of the state of an electrical contact to which the said electronic circuit is sensitive, the four parts of the key adapted to be actuated by the thumb each have a profile which curves towards the interior of the key, inclined upwardly from the centre of said key towards the exterior of each part in the preferential directions of movement of the thumb and perceptible to the touch, and an action on each of these parts results in a modification of the state of an electrical contact to which the said electronic circuit is sensitive, and means are provided to obviate any simultaneous actuation of the different parts of one and the same key and/or any simultaneous change of the state of the electrical contacts associated with said key, and the electronic circuit is adapted to accept, for each key, when all the parts of said key are released, only the change of state of a contact which has occurred first.

The profile of each of the keys thus provides an obstacle to the movement of the relevant finger to the required position. Since the user feels this obstacle by touch he is unmistakably informed as to the position of his finger. Thanks to the large tactile memory capacity of man, the user very rapidly remembers each combination of positions of the fingers in his hand. Also, the actuation of each part of a given key is voluntarily made exclusive so that in combination with the tactile recognition any actuation errors are obviated even in the case of rapid operation. This also enables the different parts of each key to be kept very close together so that small keys can be made with the result that the finger movements are minimized. While the keyboard efficiency is increased its dimensions can be reduced.

Other features and advantages of the invention will be apparent from the following description with reference to the accompanying drawings, which are given by way of example without limiting force and in which.

FIGS. 1 to 7 illustrate one preferred embodiment of an electronic keyboard 1 for one-hand operation for generating alphanumeric and analog characters and/or processing instructions. The keyboard 1 comprises a plurality of keys 2, 4 and an electronic circuit 10 electrically connected in conventional manner to the keys 2, 4, e.g. via a printed circuit (not shown) to interpret the state of the keys 2, 4 and deliver a signal indicative thereof in a manner to be indicated hereinafter. The electronic circuit 10 is also connected to display means 6 comprising, for example, a digital or liquid crystal display screen comprising three display zones 7, 8, 9, the function of which will also be explained hereinafter, and external connection means 12 which enable the keyboard 1 to be connected, e.g. electrically, to a keyboard-controlled device, e.g. a printer or a computer (not shown).

Figures 1, 2:
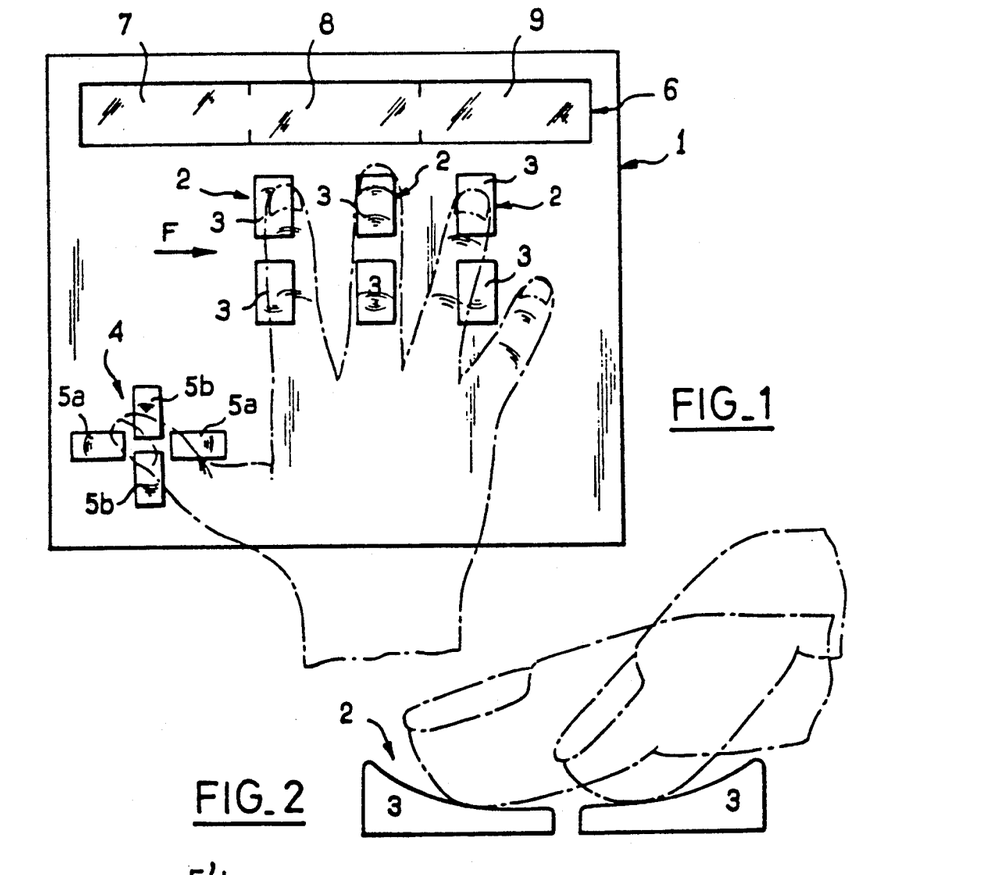
FIG. 1 is a diagrammatic plan view of a keyboard according to the invention.
FIG. 2 is an enlarged profile in the direction of the arrow F in FIG. 1 of a key intended for the fingers other than the thumb.

In the example illustrated, the keyboard 1 comprises three keys 2 associated with the fingers of a hand other than the thumb, and a key 4 associated with the thumb, each key 2 associated with a finger of the hand other than the thumb being adapted to assume three different states in response to said finger and comprising two parts 3 extending in continuation of said finger so that each of the two part 3 can be actuated by the corresponding finger at the same time as other parts 3 of adjacent keys 2 by other fingers, without substantial movement of the hand. Also, the key 4 associated with the thumb can assume five different states in response to the thumb action, said key comprising four parts 5a, 5b which are so disposed as to be actuated selectively by the thumb without appreciable movement of the hand and at the same time as a part 3 of each key 2 associated with the fingers other than the thumb.

Advantageously (FIGS. 2 to 6), the two parts 3 of each key 2 adapted to be actuated by a finger other than the thumb are sufficiently close together to be actuated successively by a front-to-rear movement and vice-versa of the finger tip and the four parts 5a, 5b of the key 4 adapted to be actuated by the thumb comprise a first pair 5a disposed symmetrically on either side of an axis X—X' on which the other pair 5b is disposed, said parts being sufficiently close together to be actuated successively by a front-to-rear movement and vice versa of the thumb tip for one 5b of the pairs and by a movement from the inside to the outside of the hand and vice-versa of the thumb tip for the other pair 5b.

The three separate states assumed by each of the keys 2 intended for fingers other than the thumb are as follows:
First part or second part 3 actuated (states 1 and 2)
First and second part 3 non-actuated or released (state 3),
while the five separate states assumed by the thumb key 4 are as follows:
First or second or third or fourth part 5a or 5b actuated (states 1 to 4),
First and second and third and fourth part 5a and 5b non-actuated or released (state 5).

It will be seen that since the invention is applied equally to a keyboard of the sensitive type and to a keyboard of the electromechanical type, operation of a sensitive key is equivalent to simply touching said key by a finger while operation of an electromechanical key corresponds to the key being pushed in by a finger.

Figure 3:
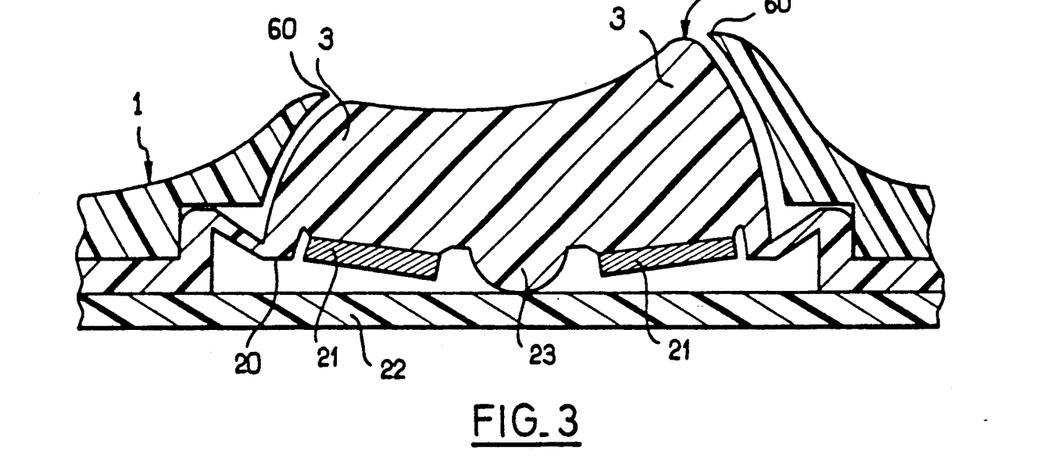
FIG. 3 is the same view as the previous one of a key intended for the fingers other than the thumb in a variant embodiment.

Also, as shown partially in FIG. 2 and more specifically in FIG. 3, the two parts 3 of the keys 2 adapted to be actuated by fingers other than the thumb each have a profile which curves towards the interior of the corresponding key and is inclined upwardly from the centre of said key towards the exterior of each part 3 in the direction of movement of the fingers and action on each of these parts 3 causes a modification of the state of an electrical contact to which the electronic circuit 10 is sensitive.

For example (FIG. 3), the inner surface 20 of each part 3 of a key 2 can support an electrically conductive member 21 which, when the corresponding part is pushed in in response to a finger, is applied against a printed circuit 22 connecting the key 2 to the electronic circuit 10 so that the state of an electrical contact carried by the printed circuit 22 opposite said inner surface 20 is changed, said change also being noted by the electronic circuit 10 to interpret the state of the corresponding key 2. Advantageously, it will be seen that the profile of each part 3 is so designed as to be perceptible to the touch.

Figure 5:
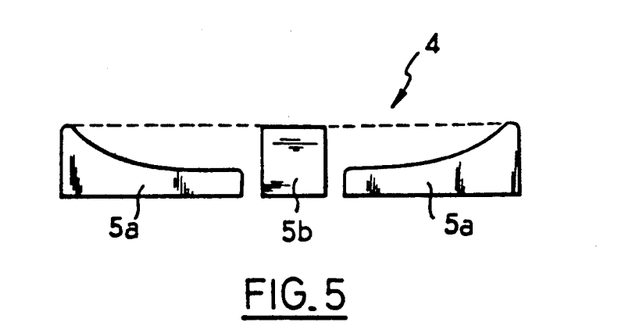
FIG. 5 is an enlarged profile of the thumb key in the direction of the arrow F' in FIG. 4.
Figure 6:
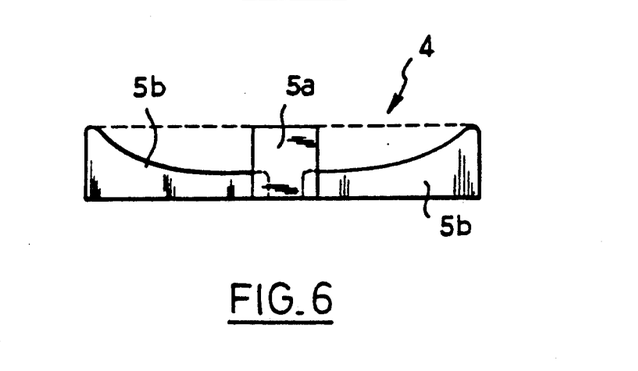
FIG. 6 is an enlarged profile of the thumb key in the direction of the arrow F" of FIG. 4.

Also, as shown partially in FIGS. 5 and 6, the four parts 5a, 5b of the key 4 intended for actuation by the thumb each have a profile which curves towards the interior of the key 4 and is inclined upwardly from the centre of said key towards the exterior of each part 5a, 5b in the preferential directions of thumb movement, and action on each of these parts causes a change in the state of an electrical contact to which the electronic circuit 10 is sensitive.

Figure 4:
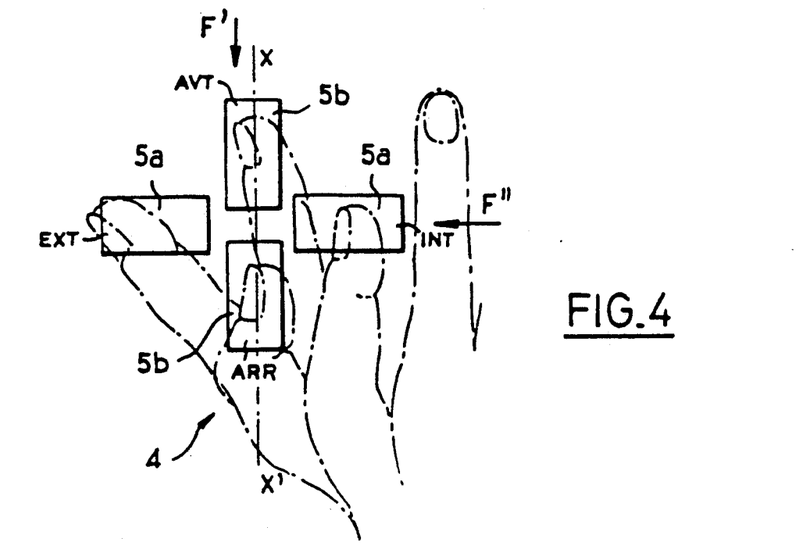
FIG. 4 is an enlarged plan view of the thumb key.

The term "preferential directions of thumb movement" denotes those which, as shown in FIG. 4, are most easily performable when the hand is placed on a flat surface, i.e., as indicated hereinabove, the front-to-rear movements and vice-versa and the movements from the inside towards the outside and vice-versa of the hand.

With regard to the change of state of an electrical contact produced by an action on each of the parts of the key intended for the thumb, the construction will preferably be the same as that used for the keys 2 actuated by the fingers other than the thumb.

The specific embodiment described in FIG. 3 in connection with a key 2 intended for the fingers other than the thumb can thus be applied to the pair of parts 5b which are adjacent. In FIG. 3 will be seen the central pivot 23 on either side of which the key 2 pivots when one of its parts 3 is actuated and which allows any simultaneous actuation of the two parts 3 of said key to be obviated, thus preventing any simultaneous change of state of the electrical contacts associated with that key. With regard to the thumb key 4, simultaneous actuation of the parts 5b is thus also obviated while in the case of the parts 5a this simultaneous actuation is prevented by the physical separation provided by the parts 5a. Also, it will be apparent that the corners 60 of the keyboard 1 (FIG. 3) adjacent the outer ends of each part 3 complete the tactile perception provided by the profile of these parts.

In the case of sensitive keys, the simultaneous actuation of the parts of each key can be avoided by electronic processing known per se. This electronic processing allows measurement and comparison of the percentages of area covered by a finger. The actuated part is then the one in which the covered area percentage is the highest at the time in question. In every case (sensitive and electromechanical keys), a logic processing causes only the part which was actuated first to be considered as actuated. Another part can be considered as actuated only if all have previously passed through a non-actuated state. In the case of sensitive keys, this logic interlock can be reinforced by creating a non-sensitive zone between the parts of each key so that even in the absence of the finger being lifted the part left by the finger as it slides can be deactivated.

Thus on the keyboard which has just been described and in which the keys 2, 4 are preferably disposed on a flat surface, any part of one of these keys can be actuated by a finger at the same time as one of the other keys by the other fingers without any appreciable movement of the hand. A keyboard having three keys intended for the fingers other than the thumb and a key intended for the thumb having the construction described hereinbefore gives $(3 \times 3 \times 3 \times 5) - 1$, i.e. 134 different key actuations and key actuation combinations adapted to generate the same number of alphanumeric or analog signs or characters. The structure of the keys, their relative positions and the number of different states that each can assume provide the best compromise in relation to simplicity, facility and reliability of use.

Figure 7:
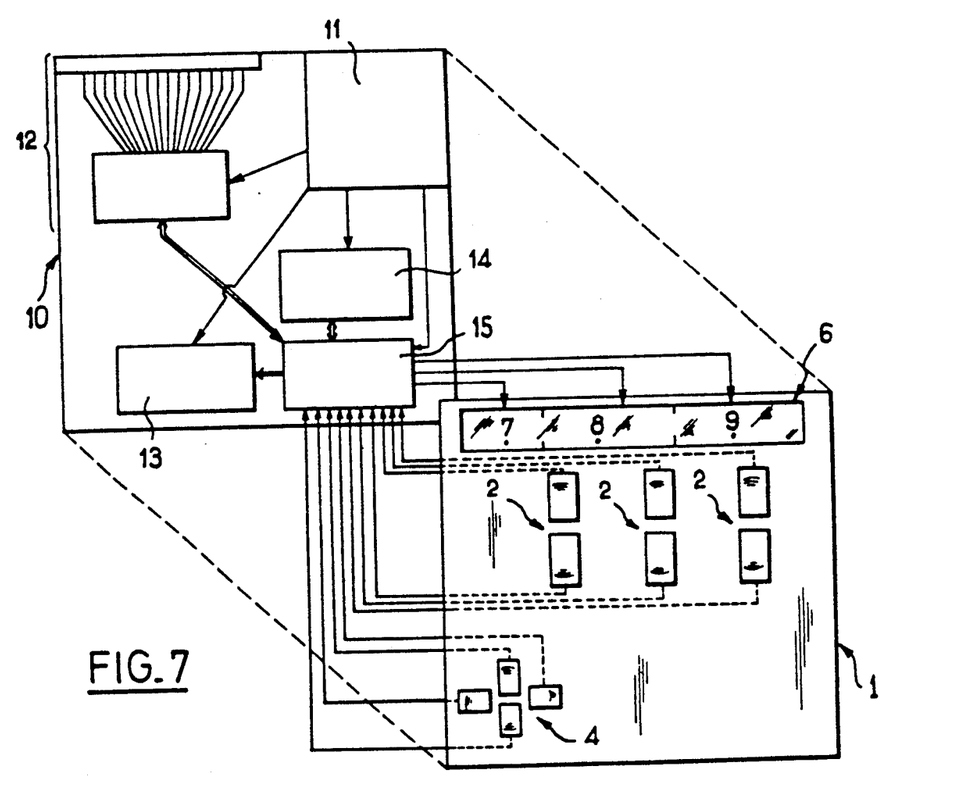
FIG. 7 is an exploded diagrammatic plan view of the keyboard of FIG. 1 showing the electronic circuit of the keyboard.

As shown in FIG. 7, the electronic circuit 10 comprises a microprocessor 15 which is electrically connected, on the one hand, to the keys 2, 4, the display means 6, and the external connection means 12 and, on the other hand, to memory means 13, 14, and supply means 11 connected to the microprocessor 15 and to the memory means 13, 14 so that this keyboard 1 is self-contained.

The memory means 13, 14 preferably comprise a random access memory (RAM) 13 and a read-only memory (ROM) 14; also, the display means 6 are divided up into three separate display zones 7, 8, 9. According to the invention, the microprocessor 15 is programmed to react instantaneously to the actuation of one or more keys 2, 4 or more specifically to the change of state of the electrical contact associated with the part of these keys which has been actuated to deliver, in a suitable coded form, e.g. in accordance with the ASCII code, a signal indicative of such actuation and apply said signal to the display means 6 so that there is displayed, e.g. in the first display zone 7, a data element corresponding, in accordance with a given code, to the key actuated or to the combination of keys actuated.

The said predetermined code is a transcoding table stored in the ROM 14, and a basic form of which specific to the invention will be detailed hereinafter.

Thus at every instant the user is informed, i.e. in real time, of the meaning of the operations that he performs on the keyboard since each time the state of a key is changed the contents of the first display zone 7 are changed accordingly.

At this stage, the signal indicative of the actuation carried out is as yet only generated and it will not be fed to the external connection means 12 for immediate delivery to the keyboard-controlled device or, optionally, to the RAM 13 for temporary storage, until it has been validated.

According to the invention, this validation is provided by the fingers other than the thumb being lifted, i.e. release of all the corresponding keys.

More specifically, the microprocessor 15 is programmed in such a manner that a signal indicative of the data element displayed in the first display zone 7 is fed to the external connection means 12 or the RAM 13, on the one hand, and to the second display zone 8 of the display means 6, on the other hand, only when all the keys 2 associated with the fingers other than the thumb have been released, the signal delivered at the time of release of said all keys being the signal indicative of the data element displayed in the first display zone 7 a predetermined time "n" before said time of release the data element corresponding to said signal being then displayed in said second display zone 8 of the display means 6 while the first display zone 7 is cleared prior to the generation of a new signal. The value "n" is parametrable to adjust to the operator's level of skill. This value can, for example, vary between two-tenths of a second and five seconds. Thus the user can try by feel to find the combination which gives the required signal, correct the combination of positions of his fingers before the signal is validated whereas on conventional keyboards such correction is possible only in respect of the characters because the orders are generally executed immediately and at all events require a rearward return followed by execution of the proper combination, and finally the operator can benefit from the advance of his skill without being penalized by the operating procedures which might have been provided for the beginner to be successful in using the keyboard or, conversely, which might compel the beginner to make continual corrections or look up various and always bulky handbooks.

Unlike the fingers, the part played by the thumb is different. According to the invention, lifting the thumb brings the five-state key into a non-activated state (state 5) but plays no part in the validation of the signal. The validated signal is simply different when the operator's thumb activates one of the five states The thumb can therefore remain in a stable position in one of the five states provided. Thus each state of the thumb key 4 when activated allows access to five sets of characters, signs or instructions in the manner to be described hereinafter. As a result of the tactile recognition of the position of the thumb as provided by the shape of the key, the operator knows at all times what set he has access to for the action of the fingers other than the thumb, without having to look at any status indicator. Also, this is similar to the type of operation of conventional capital shift keys which enable a sign to be generated at the same time as a key is activated, but in this case it is four times instead of just once, and without having to use two hands on the right and left, and the disadvantage of keys of the "Ctrl" or "Alt" type of which there are only one is avoided thus preventing the operator who uses two hands from retaining the specialization of each hand. This advantage is all the greater when the message for preparation comprises varying signs.

The mobility of the thumb is finally used to generate important instructions such as "space", "enter", "Ctrl" and "return to basic state". According to the invention these are generated and validated by the action of the thumb, production of the corresponding signal occurring solely when all the other fingers are lifted and the thumb effects a downward and upwards sequence on one of the four parts 5a, 5b of the thumb key 4. For example (see FIG. 4), "space" is obtained by an action on the inner part "INT", "Enter" by an action on the rear part "ARR", "Ctrl" by an action on the outer part "EXT" and "return to basic state" by an action on the front part "AVT". On the other hand, when any of the keys 2 for fingers other than the thumb is actuated there is neither generation nor validation of a signal when the thumb key 4 changes state, but simply a change of the signal generated directly as a function of the change of set due to the movement of the thumb.

The third display zone 9 can be used, for example, to display in real time the state of the keyboard either in code or plain language.

Figure 9:
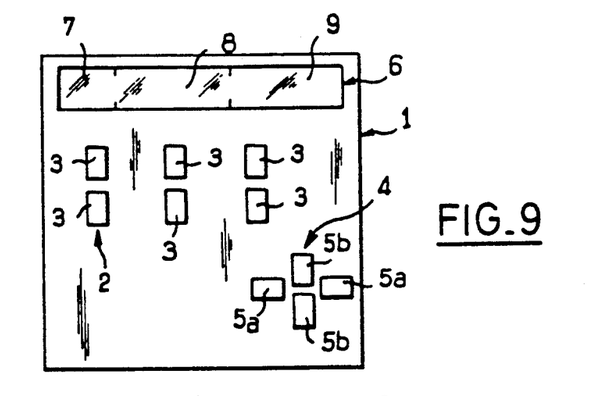

The keyboard described with reference to FIGS. 1 to 7 does not occupy an area more than $6 \times 8$ cm$^2$, i.e. that of a credit card. Also, it can readily be adapted to various types of use. For example, FIG. 9 illustrates a keyboard 1 for operation by the left-hand by a left-handed user although it can also be used by a right-handed person wishing to use his more agile right hand.

Figure 8:
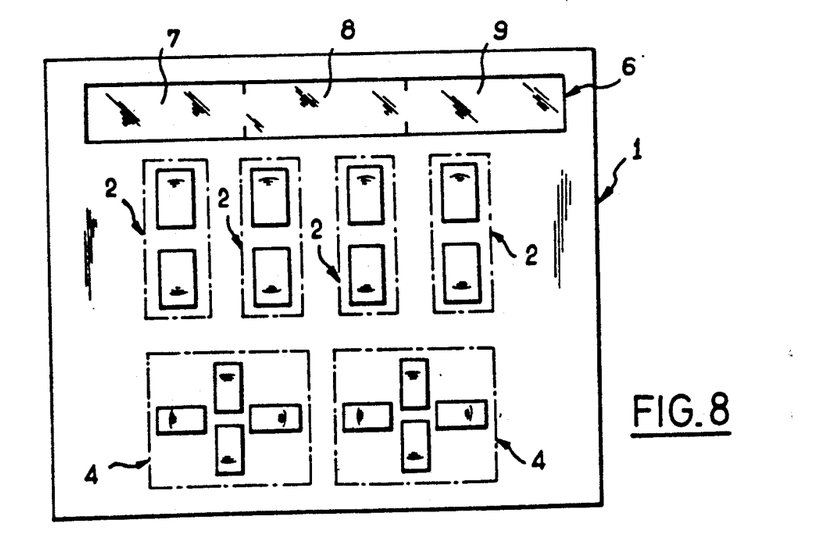
FIGS. 8 to 14 are diagrammatic views of keyboards according to variant embodiments of the invention and FIGS. 15 and 16 illustrate the basic transcoding table according to the invention.
Figure 10:
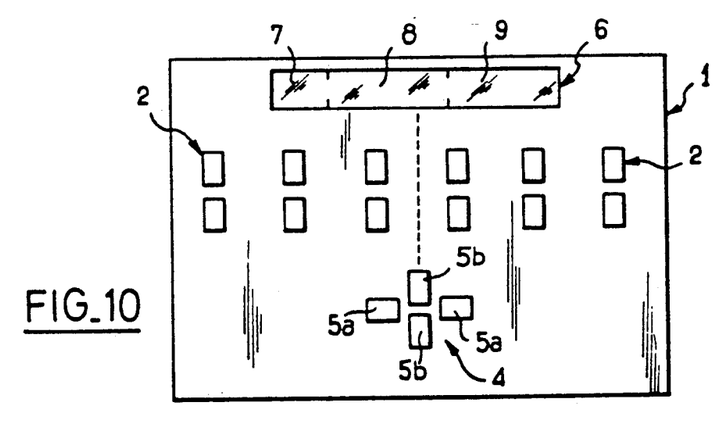

FIGS. 8 and 10 illustrate a keyboard 1 intended for work stations shared by various users. On the keyboard shown in FIG. 10 only the finger keys 2 are duplicated and disposed symmetrically on either side of the thumb key 4. The microprocessor then recognizes that the user is working with one hand or the other by the nature of the finger keys 2 activated. The significance of these keys is also transposed symmetrically because it is the position of a key in relation to the hand using it which determines its function. Thus the keys on the extreme right and extreme left of the keyboard are both associated with the third finger respectively of the right hand and of the left hand. Also, the "INT" and "EXT" parts of the thumb key 4 change their roles depending on whether the right hand or left hand finger keys 2 are used. Conversely, on the keyboard shown in FIG. 8, it is the thumb key 4 which is duplicated while the finger key 2 on the farthest right of the keyboard will not normally not be used by a left hand and the one farthest to the left will normally not be used by a right hand. In this case, the use of the keyboard by a left hand or right hand can also be recognized by the microprocessor (by suitable programming) according to the thumb key 4 used. The keyboard shown in FIG. 8 also does not occupy an area greater than 40 cm$^2$, The keyboards in FIGS. 11 and 12 comprise four keys 2 having three states, one for the index finger, one for the second finger, one for the third finger and one for the little finger, and a key 4 having five states. This type of keyboard mobilises all the fingers of the hand and directly provides $3 \times 3 \times 3 \times 3 \times 5 - 1 = 404$ different signs or analogs. This embodiment is the most powerful and provides a number of directly accessible signs far greater than those of the extended ASCII code, which contains only two hundred and fifty-six. Depending upon the applications and the users, it is possible either to use just some of the combinations in order that a natural mnemonic table of correspondence can be used without undue stress, or use the two hundred and seventy additional combinations directly available $(404 - 134 = 270)$ to generate more elaborate signs such as entire syllables or signs specific to an application in a given art, or build up an entirely syllabic system for languages using only about 350 syllables.

Figure 11:
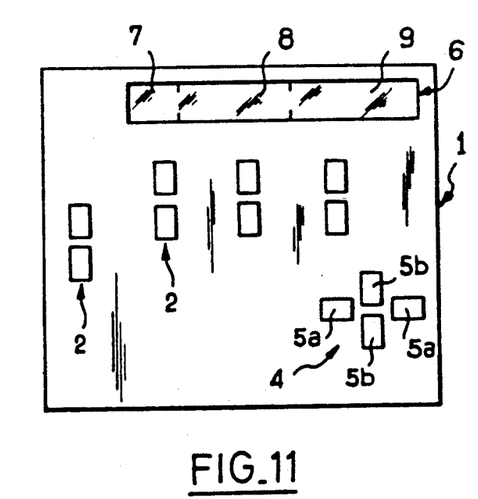
Figure 12:
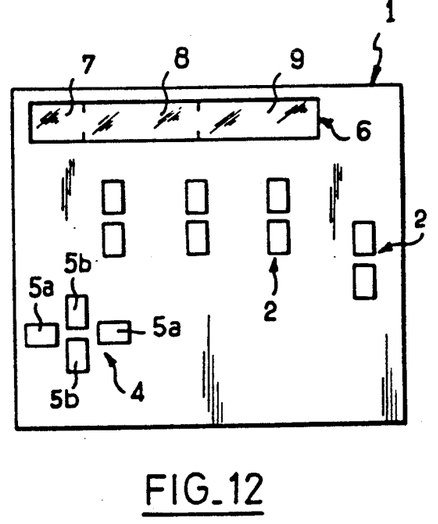

The keyboards shown in FIG. 11 (left hand) and FIG. 12 (right hand) will advantageously be made compatible with those of the preceding figures so that the changeover from using the four-finger keyboard to a five-finger keyboard may be effected with full retention of the knowledge acquired, the two hundred and seventy direct additional possibilities being made accessible by the use of the supplementary key (little finger) without changing the signs that are accessible when this key is not used or missing.

Figure 13:
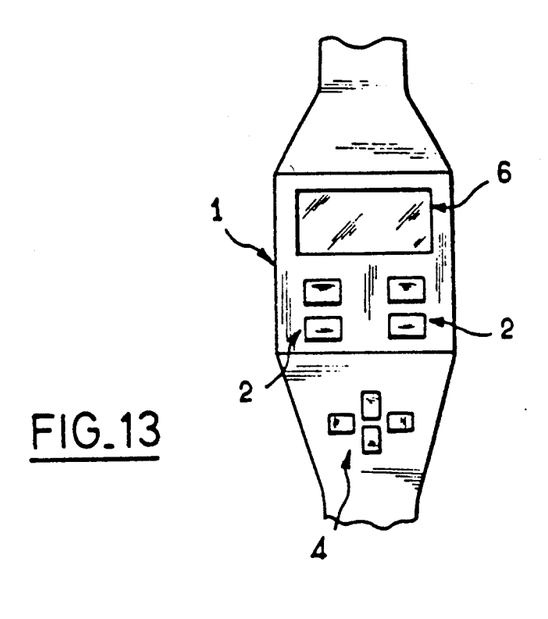

The keyboard shown in FIG. 13 comprises just two three-state keys 2 and a five-state key 4 which provide direct generation of $(3 \times 3 \times 5 - 1) = 44$ different signs. This embodiment is very advantageous because of its compactness and the small area required for its installation and the fact that it uses only the most agile fingers of the hand. It is also suitable for any embodiments of the wrist type (watches) or credit card type (notebooks, calculators) where the keyboard part occupies just $3 \times 3$ cm$^2$ while directly providing all the digits, letters and operation codes required, not to mention all the signs which are accessible by triggering a change of status by an action similar to that of the shift keys or caps lock or nums-lock keys on conventional keyboards.

At this stage of the description of the invention a mnemonic correspondence must be provided between the signs used in the written messages and a particular combination of finger positions. It is conventional practice to make keyboards parametrable depending upon the user's preferences. For example, microcomputer keyboards can, by the simple use of a small program, change from the QWERTY standard to the AZERTY standard without, however, being able to change the signs engraved on the keys. With these parametrable keyboards a distinction is made between the elementary signal generated by pushing in a key and the interpretation that the computer makes thereof. The changeover between the generated signal and the signal that will be accepted for the user's requirements is by means of transcoding tables. These transcoding tables are very easy to define and very flexible in use. The invention uses this method to provide the link between the various combinations of finger positions and the alphanumeric or graphic signs corresponding to the user's requirements. The actual data coding of these alphanumeric or graphic signs is whatever is required for the system to which the keyboards, irrespective of their type, are connected (ASCII code, EBCDIC code, and so on), this data coding being selected either when the keyboard is designed or on the parametering of the conditions of communication between the keyboard and the device being controlled.

The keyboards according to the invention enable this flexibility potential to be used to the maximum, since the keys have no inscriptions and there is therefore no obstacle to the user using his own transcoding table, irrespective of those used by the other successive users of the same keyboard. This faculty of enabling a single keyboard to be adapted to a whole variety of uses and users is facilitated by the fact that a distinction is made between the sign generation/display and the validation of that sign, such distinction being impossible with conventional keyboards which create a signal as soon as a key is actuated and repeat it for as long as the key is actuated. According to the invention, each user finds on an intermediate display the meaning of each combination of finger positions without being obstructed by inscriptions on the keys. The inscriptions are superfluous whereas they are indispensable in conventional keyboards.

Although it is probable, when this type of keyboard becomes widespread, that there will be many variants of tables of correspondence between the positions of the fingers and the signs generated, it is nevertheless necessary, if the keyboard is to be usable by everybody, for everybody to share a certain number of common codes such that any user can instruct the keyboard to assume the state in which he wishes to use it irrespective of the state in which the keyboard was left by the previous user.

Thus a keyboard according to the invention comprises a basic transcoding table in ROM 14, so that the microprocessor can feed a coded signal indicative of the actuation of a key part or of a combination of key parts to the display means and/or any other keyboard inputting control device connected to said keyboard to produce the signs used for the messages and instructions transmitted with the western languages (i.e. those using a variant of the Latin alphabet) or at least all the alphanumeric and analog signs of the ASCII code.

This basic transcoding table is specific to the invention and even if, as will be seen hereinafter, the keyboard microprocessor can be programmed so that the keyboard is parametrable in accordance with a different transcoding table from the basic table, it will still be possible to provide a keyboard control enabling a return to be made to the basic table. The essential characteristics of the basic table will now be described with reference to FIG. 15, when the same is associated with a keyboard of the kind described with reference to FIGS. 1 to 7.

Figure 15:
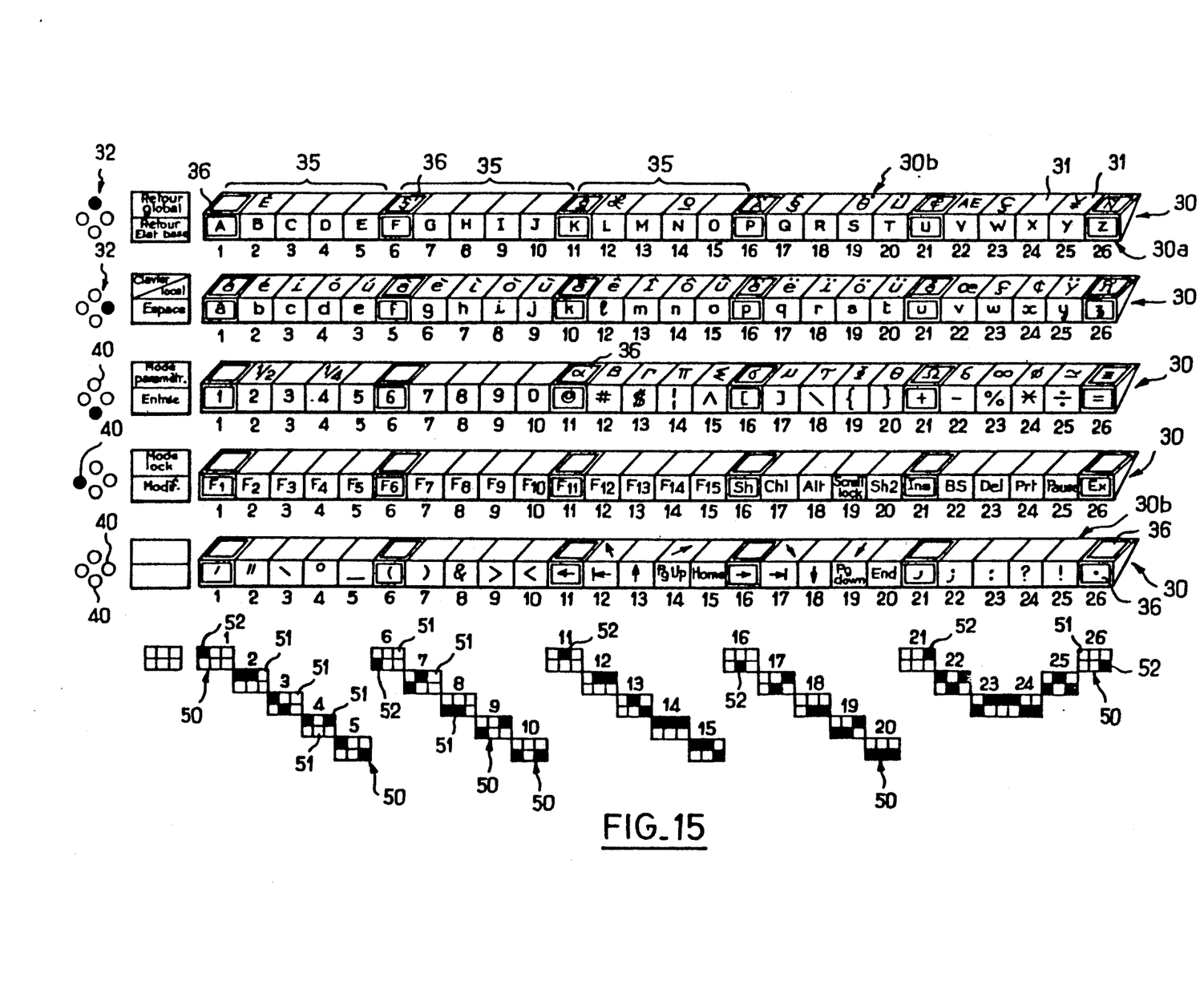

Thus the table comprises five pairs 30 of sets 30a, 30b of twenty-six divisions 31, each pair 30 being associated with a groove 32 of four circles 40. The circles 40 represent the four parts of the five-state key intended for the thumb. When one of the circles 40 is blackened that means that the corresponding part of that key is actuated. One of the five groups 32 of circles 40 has no blackening because it corresponds to the state in which none of the parts is actuated. The twenty-six divisions of each set 30a, 30b correspond to each of the twenty-six combinations of positions of fingers other than the thumb $(3 \times 3 \times 3 - 1 = 26)$. Each of the twenty-six combinations is symbolized by a rectangle 50 containing six squares 51 disposed like the six actuatable parts of these three finger keys. When a square 51 is blackened that means that the corresponding part is actuated. Each division 31 of a set 30 of 26 divisions contains a sign or the conventional representation of an ASCII instruction. The five main sets 30a correspond to the signals obtained directly, on the one hand, by the action of the thumb on the five-state key and, on the other hand, by the action of the other fingers on the three-state keys. The other five sets 30b correspond to the signals obtained after an action corresponding to a downward-upward movement sequence of the thumb on the outer part "EXT" of the five-state key.

The mnemonic principle used is that of the logic sequence. The sequences used are known by the potential users and do not require any significant learning. For example, the twenty-six letters of the alphabet are arranged in the alphabetical order A, B, C, D, E, etc. Since it would be irksome to look for the order number of a sign in a sequence of twenty-six, the sets 30a, 30b are divided into five sub-sets 35 of five signs and a sub-set of one sign, commencing with a reference sign. For example, the letters A, F, K, P, U, Z are the alphabet reference signs. The reference signs uniformly associated with the combinations 1, 6, 11, 16, 21, 26 of finger positions are shown in the double-frame divisions 36 and correspond to the six combinations 52 which are the simplest since they use the action of just one finger only. With three three-state keys, there are six combinations of this type. The other signs of each sub-set 35 of five signs are obtained by combinations of finger positions which arise logically (e.g. by circular permutation) from the use of the other fingers in addition to the finger which produces the reference sign 36. The four rectangles 50 corresponding to each of these combinations are shown below the one 52 of the reference combination and in the alignment of the ten divisions, amongst the 26 × 10 which correspond, for the fingers other than the thumb, to the symbolized combination. To facilitate referencing, the number of the corresponding combination is shown above each rectangle 50 of six squares 51.

For example, the combination 1 gives the following signs from top to bottom: thumb forward: A; thumb in inner position: a; thumb rearward: 1; thumb in outer position: F1; thumb raised: '. If "Ctrl" forward has been made, the following are obtained in the same sequence: free value; á; free value; free value; free value. And so on for the other twenty-five combinations.

It is therefore possible in this way to obtain all the signs of the ASCII code and some of those of the extended ASCII code. Also, a large number of the 130 combinations accessible via the "Ctrl" action (downward and upward action of the thumb on the outer part of the five-state key) are available for a specific use.

It is an important characteristic of the keyboards produced according to the invention that they are parametrable so as to be adaptable to the needs and preferences of a specific user. This parametering can obviously be retained in the memory of the device being controlled by the keyboard, as is done on microcomputers to change from the American QWERTY standard to another standard or to work with a specific software.

According to the invention, the parametering is also available within the keyboard in accordance with an interactive mode which will be described hereinafter.

"Ctrl" and "Enter" first gives the change to the parametering mode and shows a menu on the display means of the keyboard to offer a choice between the parametering of the communication mode, of the keyboard, and of the delay (adjustment of "n").

When the keyboard parametering is selected, the display will show the parametering (transcoding tables) already stored and retained under a specific name. It is then possible to select an existing parametering or ask for the creation of a new parametering by carrying out "End" and "Ins", followed by the specific name of the new parametering. The keyboard asks the name of the parametering of the combinations of finger positions taken as a starting base and finally the name of the code (e.g. the extended ASCII code) with which operation is required. This having been done the keyboard is in the parametering mode. In this parametering mode access to the possible combinations for the key positions is obtained by actuating each of these combinations. Indication of the or each sign which, when the parametering undergoing creation is used, is to be generated by this combination can be obtained in two ways:

either by coding each of the combinations of the basic parametering (FIG. 15) which generate the signs of the sequence that is to be stored, "Ins" being used to separate them, or by declaring by "Alt" + the position of each sign in the code (e.g. ASCII) + "Ins" each of the signs of the sequence to be stored.

The end of the sequence is declared by "Enter".

The end of the parametering is obtained by making "Ctrl" + "Enter". The keyboard then asks if the user wishes to return to the existing parametering or validate what has just been created.

Of course the number of possible parameterings will be limited by the memory capacity available in the keyboard used and the number of characters stored in a sequence will be limited to the number of positions of the first display zone of the keyboard.

The table in FIG. 15 illustrates one type of keyboard. The beginner can therefore use it as a guide. However, unlike learning on a conventional keyboard the user does not look at the keys and it is his nervous system which transcodes the symbolic representation to the positioning of the fingers. This method of operation is very similar to that of acquiring a reflex and unlike the spontenous work on a conventional keyboard the user enjoys a real inducement to work by separating his mind from the action of his fingers.

Figure 16:
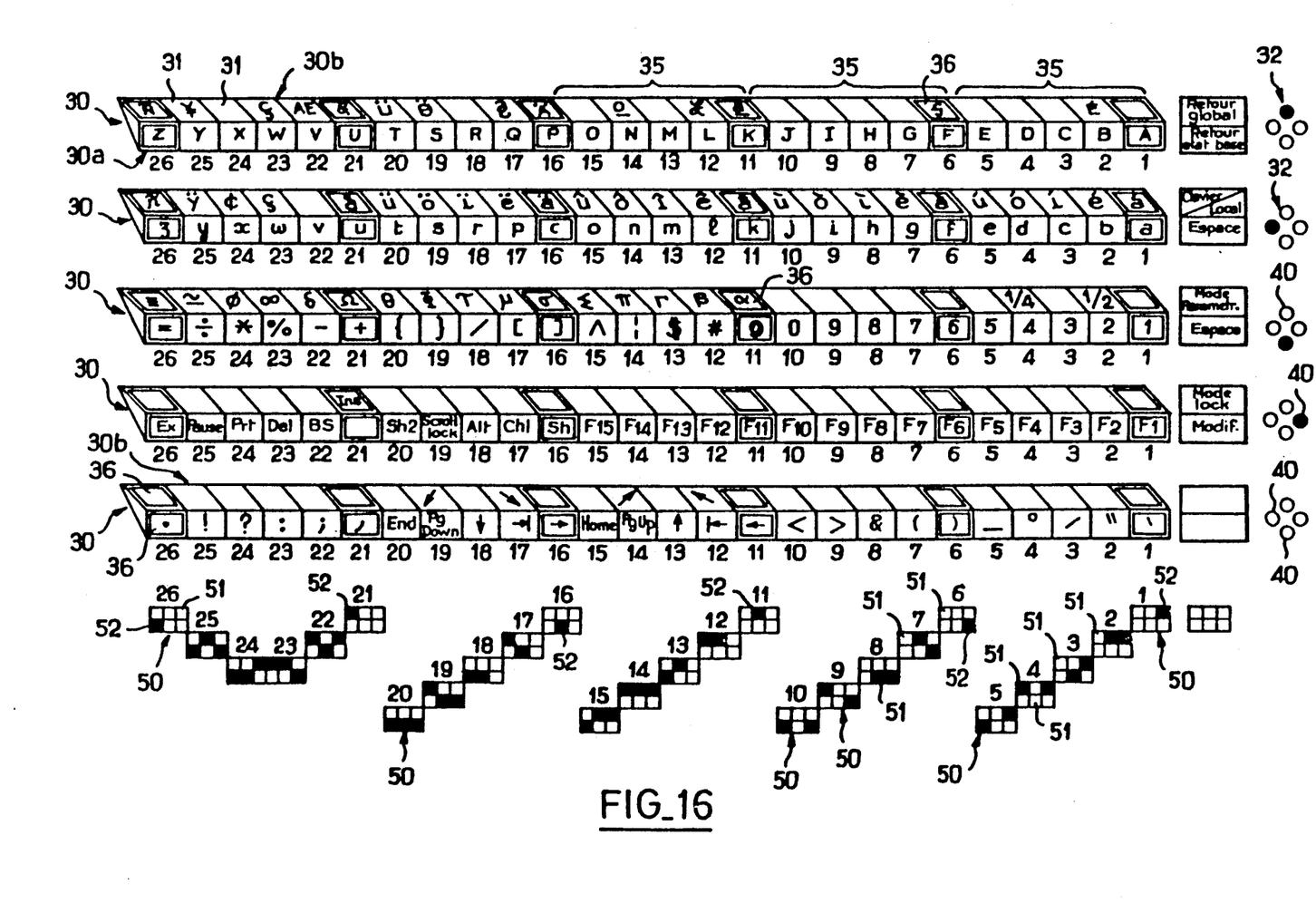

This dissociation is also manifest when a user changes from a right-hand keyboard to a left-hand keyboard or vice-versa. Mentally the user thinks, for example, "left hand index" where there was the "right hand index" and not the finger farthest on the right or the finger farthest on the left. That is why the right hand and left hand keyboards according to the invention are made symmetrically and the table shown in FIG. 15 corresponding.to right hand use has a corresponding symmetrical table shown in FIG. 16 corresponding to left hand use. However, it will be apparent that this is only a symbolic representation and that the transcoding table of a left hand keyboard is identical to that of the right hand keyboard.

In addition, the small size of keyboards according to the invention means that they can also be used as personal independent portable devices. According to the invention, local mode operation is also provided together with facilities for connecting and communicating with all conventional keyboard controlled devices. Thus the connection means 12 comprise a multi-purpose connecting plug to which can be connected a number of cables for connection to the input of the keyboard of the device for control, the "RS 232 C" input of a microcomputer, of a printer, a magnetic storage device or a telephone connection for remote communication.

In order to limit the mechanical connections and disconnections, some of the link will advantageously be made by techniques known per se, by infra-red or a similar contact-less coupling device to a receiver device permanently connected to any one of the above tools. The different communication modes are selectable and parametrable in manner known per se similarly to that of the parametering of the keyboard.

Figure 14:
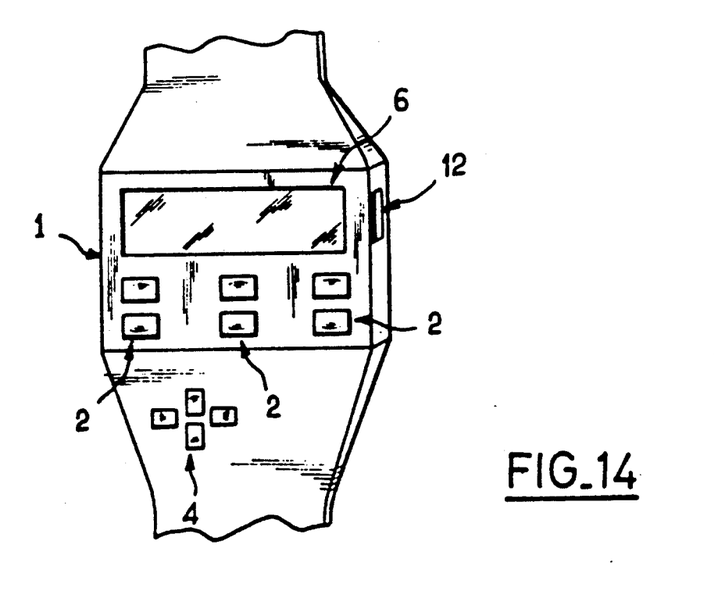

Thus the present invention proposes both keyboards operable by one hand and without the need to look at them, and also small portable personal devices as that shown in FIG. 14, capable of benefiting from increasing miniaturization of all electronic devices (processors, memories, displays etc), these keyboards and portable devices being easy to learn and opening up to those who use them all electronic acquisition, writing and instruction operations.

Also, thanks to the basic table, the touch-sensitive shape of the keys, validation when all the fingers other than the thumb have been lifted, instantaneous display of the signal corresponding to any combination of actuated positions, the resulting keyboard is very easy to memorise since it uses less than 7 to 9 simple principles in accordance with the advice of experts:

a homogeneous set is selected by means of the thumb (capitals, small letters, digits, etc), a sub-set is selected by the choice of one of the six parts of three keys, the sign mentally required is found by the sequential declension of the sub-set, effective correspondence with what has been learned is indicated by the tactile sensation felt by the fingertips, it is possible to search around the incorrect position by studying the first display zone by reference to a visually structured table, the tactile sensation corresponding to the required sign is memorized by simultaneous mental and physical release.

Thus a beginner can effectively use the keyboard after just a few minutes and a trained person can operate by reflex action without looking at any table or keyboard for the frequent signs and rapidly locate the less frequent signs probably more quickly than on a conventional keyboard in which the letters, signs and functions are distributed arbitrarily and often differently from one device to another.

Of course this invention is not limited to the examples described and illustrated and numerous modifications can be made thereto without departing from the scope of the invention.

I claim:

1. An electronic keyboard for one-hand operation, more particularly for generating alphanumeric and analog characters and/or processing instructions, the keyboard comprising a plurality of keys and an electronic circuit electrically connected to said key to interpret the state of the keys and to deliver a signal indicative thereof, said electronic circuit also being connected to display means and external connection means, said keyboard comprisisng three keys associated with the fingers of the hand other than the thumb and one key associated with the thumb, each key associated with a finger of the hand other than the thumb comprising two parts extending in continuation of said finger, so that each of the two parts can be actuated by the corresponding finger at the same time as other parts of adjacent keys by other fingers, without appreciable movement of the hand, and the key associated with the thumb can assume five different states in response to the thumb, said thumb key comprising four parts which are so disposed as to be actuated selectively by the thumb without appreciable movement of the hand, wherein the actuation of the keys associated with the fingers other than the thumb permits obtaining 26 different characters, the electronic circuit being so arranged that a) a first group of six characters is obtained when the different parts of said three keys are actuated selectively by one of said fingers, b) a second group of twelve characters is obtained when two key parts corresponding to two different keys are actuated selectively simultaneously by two fingers, and c) a third group of eight characters is obtained when three key parts corresponding to three different keys are actuated selectively simultaneously by three fingers.

2. A keyboard according to claim 1 wherein the two parts (3) of each key (2) adapted to be actuated by a finger other than the thumb are sufficiently close together to be actuated successively by as front-to-rear movement and vice-versa of the finger tip.

3. A keyboard according to claim 1, wherein the four parts (5a, 5b) of the key adapted to be actuated by the thumb comprise a first pair (5a) disposed symmetrically on either side of an axis (X—X') on which the other pair (5b) is disposed, said parts being sufficiently close together to be actuated successively by a front-to-back movement and vice-versa of the thumb tip for one of the pairs (5b) and by a movement from the inside to the outside of the hand and vice-versa of the thumb tip for the other pair (5a).

4. A keyboard according to claim 1, wherein the two parts (3) of the keys (2) adapted to be actuated by the fingers other than the thumb each have a profile which curves towards the interior of the corresponding key, inclined upwardly from the centre of said key towards the exterior of each part in the direction of movement of the fingers and perceptible to the touch, and an action on each of these parts (3) results in a change of the state of an electrical contact to which the said electronic circuit (10) is sensitive.

5. A keyboard according to claim 1, wherein the four parts (5a, 5b) of the key (4) adapted to be actuated by the thumb each have a profile which curves towards the interior of the key (4), inclined upwardly from the centre of said key towards the exterior of each part in the preferential direction of movement of the thumb and perceptible to the touch, and an action on each of these parts (5a, 5b) results in a modification of the state of an electrical contact to which the said electronic circuit (10) is sensitive.

6. A keyboard according to claim 4, wherein means (23) are provided to obviate any simultaneous change of the state of the electrical contacts associated with one and the same key, and the electronic circuit (10) is adapted to accept, for each key, when all the parts of said key are released, only the change of state of a contact which has occurred first.

7. A keyboard according to claim 1, wherein the keys (2, 4) are disposed on a flat surface (1) in such a manner that any part of a key can be actuated by a finger at the same time as one of the parts of the other keys by the other fingers without appreciable movement of the hand.

8. A keyboard according to claim 1, wherein the electronic circuit (10) comprises a microprocessor (15) which is electrically connected, on the one hand, to the keys (2, 4), to the display means (6) and to the external connection means (12) and, on the other hand, to memory means (13, 14) and supply means (11) connected to the microprocessor (15) and the memory means (13, 14).

9. A keyboard according to claim 7, wherein the display means (6) comprise at least two display zones (7, 8, 9), the microprocessor (15) being programmed to react instantaneously to the actuation of one or more keys (2, 4) to deliver a signal indicative of said actuation and apply said signal to the display means (6) so that there is displayed in a first display zone (7) a data element corresponding, in accordance with a given code, to the actuated key or to the combination of actuated keys.

10. A keyboard according to claim 9, wherein the microprocessor (15) is programmed in such a manner that a signal indicative of the data element displayed in the first display zone (7) is fed to the external connection means (12) or to memory means (13), on the one hand, and to a second display zone (8) of the display means (6), on the other hand, only when all the keys (2) associated with the fingers other than the thumb have been released, the signal delivered at the time of release of said all keys being the signal indicative of the data element displayed in the first display zone (7) a predetermined time (n) before said time of release, the data element corresponding to said signal being then displayed in said second display zone (8) of the display means (6).

11. A keyboard according to claim 10, wherein the said predetermined time (n) is adjustable.

12. A keyboard according to claim 10, wherein the microprocessor (15) is programmed to deliver signals previously stored in the memory means (13) to the external connection means (12).

13. A keyboard according to claim 8, comprising at least three keys (2) adapted to be actuated by the fingers of one hand other than the thumb, and in a memory (14), a basic transcoding table which enables the microprocessor (15) to deliver a coded signal indicative of the actuation of a key part (3, 5a, 5b) or of a combination of key parts, to the display means (6) and/or any keyboard input control means connected to said keyboard to produce at least all the alphanumeric and analog characters of the ASCII code by generation of at least one hundred and thirty-four different coded signals.

14. A keyboard according to claim 13, wherein the basic transcoding table is disposed in five pairs (30) of sets (30a, 30b) of twenty-six signs or processing instructions arranged sequentially, each pair (30) of sets (30a, 30b) being accessible by actuation of one of the parts (5a, 5b) of the thumb key (4).

15. A keyboard according to claim 14, wherein each set (30a, 30b) of twenty-six signs is subdivided into five sub-sets of five signs and one sub-set of one sign, the first sign (36) of each sub-set (35) being accessible by actuation of one of the different parts (3) of a single key (2) intended for a finger other than the thumb, each of the six first signs (36) being accessible by actuation of a said part (3).

16. A keyboard according to claim 15, wherein the other four signs (31) of each sub-set (35) of five signs are disposed in a universal logic sequence, such as alphabetical order, these other four signals of the first four sub-sets being accessible in accordance with a combination of actuation of parts (3) of the keys (2) intended for the fingers other than the thumb, obtained logically by circular permutation, and comprising at least actuation of the part corresponding to the first sign (36) of the corresponding sub-set (35), while the second and third signs, on the one hand, and the fourth and fifth signs, on the other hand, of the fifth sub-set of five signs are accessible in the same way respectively from actuation of the key part authorizing access to the first sign of said fifth sub-set and the key part authorizing access to the single sign of the sixth sub-set.

17. A keyboard according to claim 13, wherein specific processing instructions can be generated by one or more transient actions on one of the parts (5a, 5b) of the thumb (4) only when all the keys (3) for the fingers other than the thumb have been released.

18. A keyboard according to claim 13, said keyboard being parametrable in accordance with a transcoding table different from the basis table.

19. A keyboard according to claim 1, said keyboard comprising four keys (2) intended for the fingers of a hand other than the thumb and two keys (4) intended alternatively for the thumb of the same hand, said keys (2, 4) being disposed relatively to one another and connected to the electronic circuit (10) in such a manner that the keyboard (1) is alternatively adapted to actuation by the left hand or the right hand and in that the area of the keyboard is less than or equal to 40 cm$^2$.

20. A keyboard (1) according to claim 1, said keyboard being operatively connected to a portable microcomputer or micro-calculator.

* * * * *